(12) United States Patent
Suga et al.

(10) Patent No.: US 7,550,366 B2
(45) Date of Patent: Jun. 23, 2009

(54) METHOD FOR BONDING SUBSTRATES AND DEVICE FOR BONDING SUBSTRATES

(75) Inventors: Tadatomo Suga, Tokyo (JP);
 Mohammad Matiar Rahman Howlader, Ontario (CA); Tomoyuki Abe, Himeji (JP)

(73) Assignee: Ayumi Industry, Himeji-shi, Hyogo (JP)

( * ) Notice: Subject to any disclaimer, the term of this patent is extended or adjusted under 35 U.S.C. 154(b) by 0 days.

(21) Appl. No.: 11/293,663

(22) Filed: Dec. 2, 2005

(65) Prior Publication Data
US 2007/0128825 A1 Jun. 7, 2007

(51) Int. Cl.
 *H01L 21/30* (2006.01)
(52) U.S. Cl. .................. 438/455; 257/E21.122
(58) Field of Classification Search .............. 438/455
 See application file for complete search history.

(56) References Cited

U.S. PATENT DOCUMENTS 4,875,284 A * 10/1989 Ogata et al. ................ 29/830

FOREIGN PATENT DOCUMENTS

JP A-10-092702 4/1998

OTHER PUBLICATIONS

Official Notice of Reason for Refusal issued in connection to Japanese Patent Application No. 2003-137882, Oct. 4, 2005.
Hideki Takagi, Ryunosuke Maeda, Tadatomo Suga, "Room-temperature bonding of wafers made of different materials by using a metal film as intermediate layer", Proceeding of the 2001 Autumn Conference of the Japan Society of Precision Engineering, Japan, the Japan Society of Precision Engineering, Sep. 10, 2001, p. 607.

\* cited by examiner

*Primary Examiner*—W. David Coleman
(74) *Attorney, Agent, or Firm*—Fox Rothschild LLP (57) ABSTRACT

A method for bonding of substrates has a steps of irradiating surfaces of the substrates respectively in a vacuum with both an inert gas beam and a metal beam thereby forming island shaped thin metal films on the surfaces of the substrates, and surface-activated bonding of the substrates through the island shaped thin metal films by contacting the surfaces of the substrates each other.

11 Claims, 7 Drawing Sheets

METHOD FOR BONDING SUBSTRATES AND DEVICE FOR BONDING SUBSTRATES

BACKGROUND OF THE INVENTION

1. Field of the Invention

This invention relates to a substrates bonding method and a substrates bonding device for surface-activated bonding substrates.

2. Description of Related Art

As one of techniques for bonding substrates which are made of varying kinds of materials, a surface-activated bonding technique has been attracting attention. In the surface-activated bonding, substrates are deprived of an impurity by having the surfaces thereof exposed to an inert gas beam in a vacuum. As a result, a state having dangling bonds remain naked (the state having the activated surfaces) is formed on the surfaces of the substrates. Thereafter, the substrates are bonded by causing the surfaces of the substrates to contact each other.

Japanese Patent Application H10-927025A discloses a technique for mutually bonding silicon wafers by irradiating surfaces of silicon wafers with an inert gas ion beam or an inert gas neutral atom beam prior to mutually bonding the silicon wafers thereby removing an impurity from the surfaces of the silicon wafers and effecting mutual bonding of the silicon wafers at normal room temperature.

Since the surface-activated bonding techniques of this principle allow pertinent treatments to be performed at low temperatures as compared with the other substrate bonding techniques such as soldering, they are expected to find application to substrates of varying materials.

The conventional surface-activated bonding techniques are indeed capable of bonding metals and semiconductors by treatments at low temperatures. They, however, are not easily applied to the mutual bonding of substrates whose surfaces are formed of quartz, silicon oxide, silicon nitride, sapphire, $LiNbO_3$, and other ionic crystals. As a result, it has been difficult to accomplish mutual bonding of substrates whose surfaces are made of such materials by a treatment performed at a low temperature.

It has been difficult, for example, to apply the surface-activated bonding technique to a process for mutually bonding quartz substrates with an object of manufacturing an optical device and an optical filter. Also, it has been difficult to apply the surface-activated bonding technique to the manufacture of an electronic device of a new type acquiring a cubic structure by bonding semiconductor substrates provided with electronic circuit containing a metal electrode layer and an insulator layer (silicon oxide or silicon nitride) on the surfaces of the substrates.

OBJECTS AND SUMMARY

This invention has been initiated with a view to solving the problem mentioned above. This invention, therefore, has for an object thereof the provision of a new surface-activated bonding method which enables two substrates each made of a material heretofore incapable of easily yielding to surface-activated bonding to be bonded by a treatment at a low temperature and a device therefor.

According to an embodiment of the invention, a method for bonding substrates has a step of irradiating surfaces of substrates respectively in a vacuum with both an inert gas beam and a metal beam thereby forming island shaped thin metal films on the surfaces of the substrates, and a step of surface-activated bonding of the substrates through the island shaped thin metal films by contacting the surfaces of the substrates each other.

According to another embodiment of the invention, a method for bonding substrates has a step of irradiating surfaces of the substrates respectively in a vacuum with both an inert gas beam and a metal beam thereby forming thin metal films having 1 nm to 100 nm film thicknesses on the surfaces of the substrates respectively, and a step of surface-activated bonding of the substrates through the thin metal films by contacting the surfaces of the substrates each other.

According to still another embodiment of the invention, a device for bonding substrates has a vacuum chamber for accommodating the substrates, a beam radiating part for irradiating surfaces of the substrates respectively in the vacuum chamber with both an inert gas beam and a metal beam thereby forming island shaped thin metal films on the surfaces of the substrates, and a bonding mechanical part for surface-activated bonding of the substrates through the island shaped thin metal films by contacting the surfaces of the substrates each other.

DETAILED DESCRIPTION OF PREFERRED EMBODIMENTS

Now, a preferred embodiment of a device for bonding of substrates according to this invention will be described in detail below with reference to the drawings annexed hereto. Dimensions in the drawings used for this explanation are occasionally exaggerated for ensuring the clarity of the specification.

The device of the present embodiment for bonding of substrates irradiates the surfaces of the substrates respectively with both an inert gas beam and a metal beam in a vacuum chamber and consequently induces formation of island shaped thin metal films on the surfaces of substrates and causes the substrates to undergo mutual surface-activated bonding through the thin metal films. Particularly, the device for bonding the substrates is enabled, by irradiating the surfaces of the substrates respectively with both an inert gas beam and a metal beam in the vacuum chamber, to form a thin metal film having thickness in the range of 1 nm-100 nm and more preferably in the approximate range of 1 nm-10 nm on the surfaces of the substrates respectively.

Figure 1:
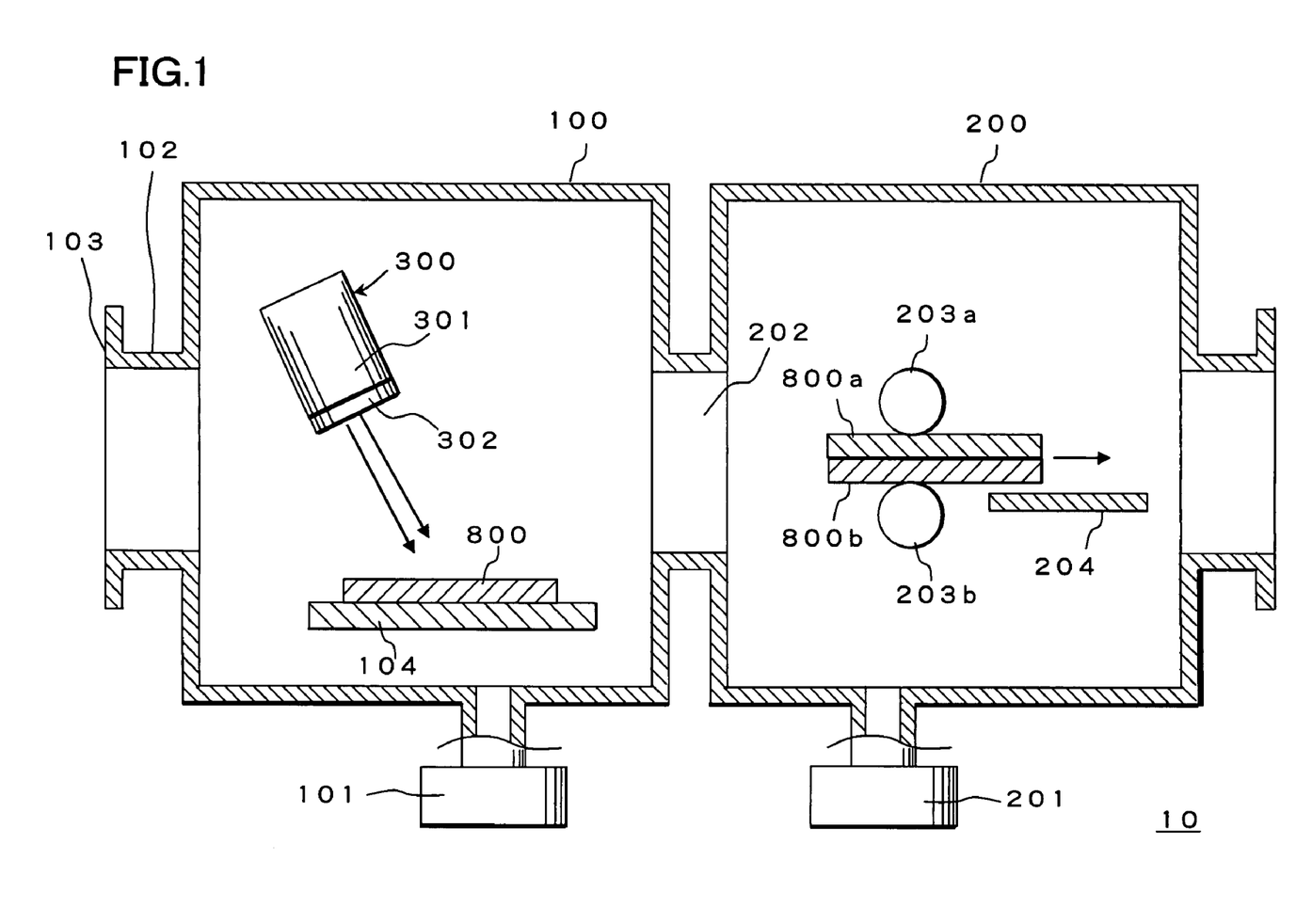
FIG. 1 is a diagram schematically illustrating a device of the present embodiment.

FIG. 1 is a diagram schematically illustrating the device of the present embodiment for bonding substrates. Substrates 800 to be bonded in the present embodiment are preferably formed of semiconductor, ceramics, glass, plastic, or other materials of ionic crystals. The substrates 800 may semiconductor substrates provided with electronic circuits containing a metal electrode layer and an insulator layer on the surfaces of the substrates respectively.

A device 10 of the present embodiment for bonding substrates may be furnished with a radiating chamber 10 for radiating an inert beam, and a weight applying chamber 200 for bonding the substrates which have been treated in the radiating chamber 100.

The radiating chamber 100 constitutes a vacuum chamber for accommodating the substrates 800. The interior of the radiating chamber 100 is evacuated by a vacuum pump 101 to a higher vacuum than a degree of vacuum of $10^{-2}$ Torr (about 1 Pa) and preferably to a higher vacuum than $10^{-5}$ Torr (about $10^{-3}$ Pa). The radiating chamber 100 is provided with an output port 102 for the substrates 800. The output port 102 is furnished with an openable door 103. The substrates 800 are conveying into the radiating chamber 100 by a conveying device such as a robot which is not shown herein. The radiating chamber 100 is provided therein with a substrate retaining member 104 for retaining a substrate 800. The substrate retaining member 104 retains the substrate 800 which has been conveyed into the radiating chamber 100.

The radiating chamber 100 is provided therein with a beam radiating part 300. The beam radiating part 300 radiates both an inert gas beam and a metal beam to form island shaped thin metal films on the surfaces of the substrates 800 respectively. Here, the inert gas beam includes an inert gas ion beam and/or an inert gas neutral atom beam as will be specifically described herein and the metal beam includes a metal ion beam and/or a metal neutral atom beam.

Specifically, the beam radiating part 300 is furnished with a beam source 301 for irradiating the inert gas ion beam or the inert gas neutral atom beam, and a grid 302 made of a metal and disposed in the opening thereof.

The beam source 301 constitutes a main body of the beam radiating part 300 and is furnished with an electrode for allowing application of voltage thereto. When argon gas is taken as an example of the inert gas, the argon gas inside the beam source 301 is made to assume the state of plasma under the applied voltage and consequently give rise to an argon ion. Then, the generated argon ion is moved to the opening by the electric field based on the voltage mentioned above and finally expelled through the opening to the exterior. Incidentally, the inert gas ion beam such as argon ion may be used in the unmodified form in irradiating the surfaces of the substrates 800. For the purpose of enabling the surfaces of the substrates 800 to avoid static electrification, at least part of the argon ion may be neutralized in the neighborhood of the opening. In other words, the inert gas neutral atom beam which results from neutralizing the inert gas ion beam such as argon ion beam may be used in irradiating the surfaces of the substrates 800. That is, the term "inert gas beam" as used in the present specification includes an inert gas ion beam, an inert gas neutral atom beam, and a beam which arises from mixture of an inert gas ion beam and an inert gas neutral atom beam. The beam source 301 itself is similar in structure to the equivalent heretofore available in the market with the exception of the fact that the voltage applied to the beam source 301, namely the energy exerted on the inert gas ion beam or the inert gas neutral atom beam, is low as compared with what is used in the ordinary surface-activated bonding device. The explanation given here, therefore, omits any detailed information about the beam source 301.

The grid 302 which is disposed in the opening of the beam source 301 is formed of a metal. Specifically, the grid 302 may be formed of such a metal as iron (Fe), titanium (Ti), or gold (Au). Part of the inert gas beam generated in the beam source 301 collides against the grid 302 and produces a sputtering action on part of the grid 302. Then, the sputtered metal atoms are allowed to land on the substrates 800. Thus, the grid 302 is enabled, by receiving the inert gas beam from the beam source 301, to fulfill the role of generating the metal beam and irradiating the substrates 800 with this metal beam. Here, the term "metal beam" as used in the present specification includes a metal ion beam, a metal neutral atom beam, and a beam arising from mixture of a metal ion beam and a metal neutral atom beam.

The weight applying chamber 200 will be explained below. The weight applying chamber 200 constitutes a vacuum chamber. It is evacuated by a vacuum pump 201 to a higher vacuum than a degree of vacuum of $10^{-2}$ Torr (about 1 Pa) and preferably to a higher vacuum than $10^{-5}$ Torr (about $10^{-3}$ Pa). The weight applying chamber 200 and the radiating chamber 100 communicate via an inlet port 202. Inside the radiating chamber 100, a pair of substrates 800a, 800b having island shaped thin metal films formed on the surfaces thereof are conveyed into the weight applying chamber 200. During the course of this conveyance, the one substrate 800a in the pair of substrates 800a, 800b is reversed so that the surfaces of the two substrates having the island shaped thin metal films formed thereon may confront each other and permit necessary mutual bonding. As a result, the pair of substrates 800a, 800b are piled one over the other so that their surfaces irradiated with an inert gas ion beam or an inert gas neutral atom beam and a metal ion beam or a metal neutral atom beam may contact each other.

The weight applying chamber 200 is provided with a bonding mechanical part. The bonding mechanical part is enabled, by establishing mutual contact between the surfaces of the substrates 800a, 800b having the island shaped thin metal films formed thereon, to effect mutual surface-activated bonding of the substrates through the thin metal film. In the present embodiment, the bonding mechanism includes a set of work rollers 203a, 203b. The work rollers 203a, 203b hold, nip and compress the pair of substrates 800a, 800b which are piled up so that their surfaces irradiated with the beams may contact each other. As a result, the substrates 800a, 800b undergo surface-activated bonding through the island shaped thin metal films. Here, the weight applying chamber 200 may be optionally provided with a heater 204 as a means to heat the substrates 800a, 800b.

From the viewpoint of applying necessary and sufficient weight to the whole of the substrates 800a, 800b while promoting the saving of space in the bonding mechanism, it is preferable to use the work rollers as the bonding mechanism. Unlike the present embodiment, it is allowable to use other bonding mechanism than the work rollers. Instead of having the weight applying part 200 provided therein with the bonding mechanical part, the radiating chamber 100 may be provided therein with a bonding mechanism. In this case, the weight applying chamber 200 does not need to be prepared separately.

Figure 2:
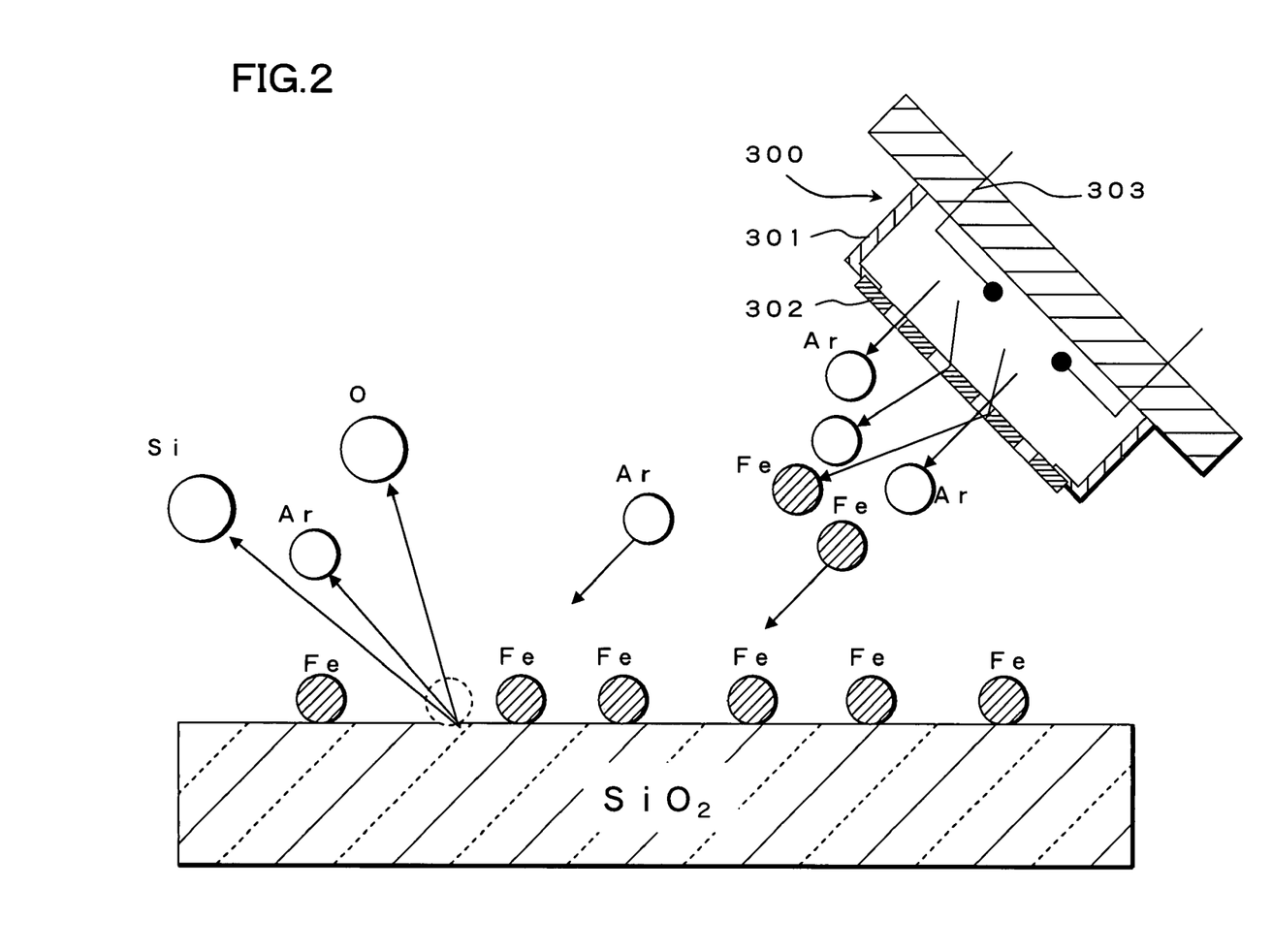
FIG. 2 is a schematic diagram for explaining the operation performed in a radiating chamber shown in FIG. 1.

FIG. 2 is a schematic diagram for explaining the function proceeding inside the radiating chamber 100 of the device 10 for bonding of substrates which is configured as described above. In FIG. 2, a silicon substrate having a silicon oxide layer (SiO$_2$ layer) formed on a surface thereof is disposed as the substrate 800. As the inert gas ion beam or the inert gas neutral atom beam, an argon ion beam or an argon neutral atom beam is used. Incidentally, FIG. 2 depicts the case of having a grid 302 formed of iron (Fe), for example.

First, an argon ion beam is generated by applying a voltage to an electrode 303 of a beam source 301 and supplying it with energy. The argon ion is moved by the electric field which is based on the electric potential difference between the electrode and the opening. Part of the argon ion is neutralized while in motion into an argon neutral atom beam and expelled to the exterior of the beam source 301. As a result, the surface of the substrate 800 is irradiated with the argon ion beam and the argon neutral atom beam. Further, part of the argon ion collides against the grid 302 which is formed of iron. As a result, the iron atoms are sputtered and the surface of the substrate 800 is irradiated with a minute amount of an iron ion beam and/or an iron neutral atom beam. Thus, the surface of the substrate 800 is irradiated simultaneously with the argon beam (the argon ion beam and/or the inert argon neutral atom beam) which is an inert gas beam and the iron beam (the iron ion beam and/or the metal neutral atom beam) which is a metal beam.

The radiated argon beam shaves part of the substrate surface (the SiO$_2$ Layer, in this case) and cleans the surface. This action similarly occurs in the case of the ordinary surface-activating treatment. At the same time that the substrate surface is cleaned, a minute amount of iron atoms (metal atoms) are piled on the substrate surface and ultimately caused to leave island shaped thin iron films (thin metal films) behind on the substrate surface. This process widely differs from what occurs in the case of the ordinary surface-activating treatment. Specifically, the ordinary surface-activating treatment is expected to avoid leaving the substance forming the grid behind on the surface of the substrate 800 and this ordinary surface-activating treatment fulfills the function of removing all the substances remaining on the surface of the substrate 800 by supplying the argon beam with a comparatively high energy. In contrast thereto, the surface-activating treatment of the present embodiment dares set the energy to be fed to the argon beam at a low magnitude as compared with the ordinary surface-activating treatment. As a result, part of the metal atoms survives on the surface of the substrate 800. This fact constitutes one of the characteristic properties of the treatment of the present embodiment for the bonding of substrates. Specifically, the surface-activating treatment of the present embodiment is enabled, by adjusting the voltage applied to the beam source 301, balance the function of having the argon beam shave part of the surface of the substrate 800 and the function of allowing the metal atoms to pile on the surface of the substrate 800. As a result, the island shaped thin metal films having a prescribed thickness (on the order of several nm, for example) are formed. To be specific, the voltage to be applied to the beam source 301 is preferred to be in the range of 50 V-500 V. The voltage thus applied, however, depends considerably on the device as a matter of course. Then, the duration of the radiation of the argon beam is preferably in the range of 1 second-30 minutes. As a result, island shaped thin metal films having a thickness in the range of 1 nm-100 nm, preferably a thickness approximating to several nm, are formed. The fact that the surface-activated bonding is accomplished by having the thin metal film of a thickness in the approximate range of 1 nm-100 nm, preferably in the approximate range of 1 nm-10 nm, formed on the surface of the substrate characterizes the treatment of bonding substrates in the present embodiment.

Figure 3:
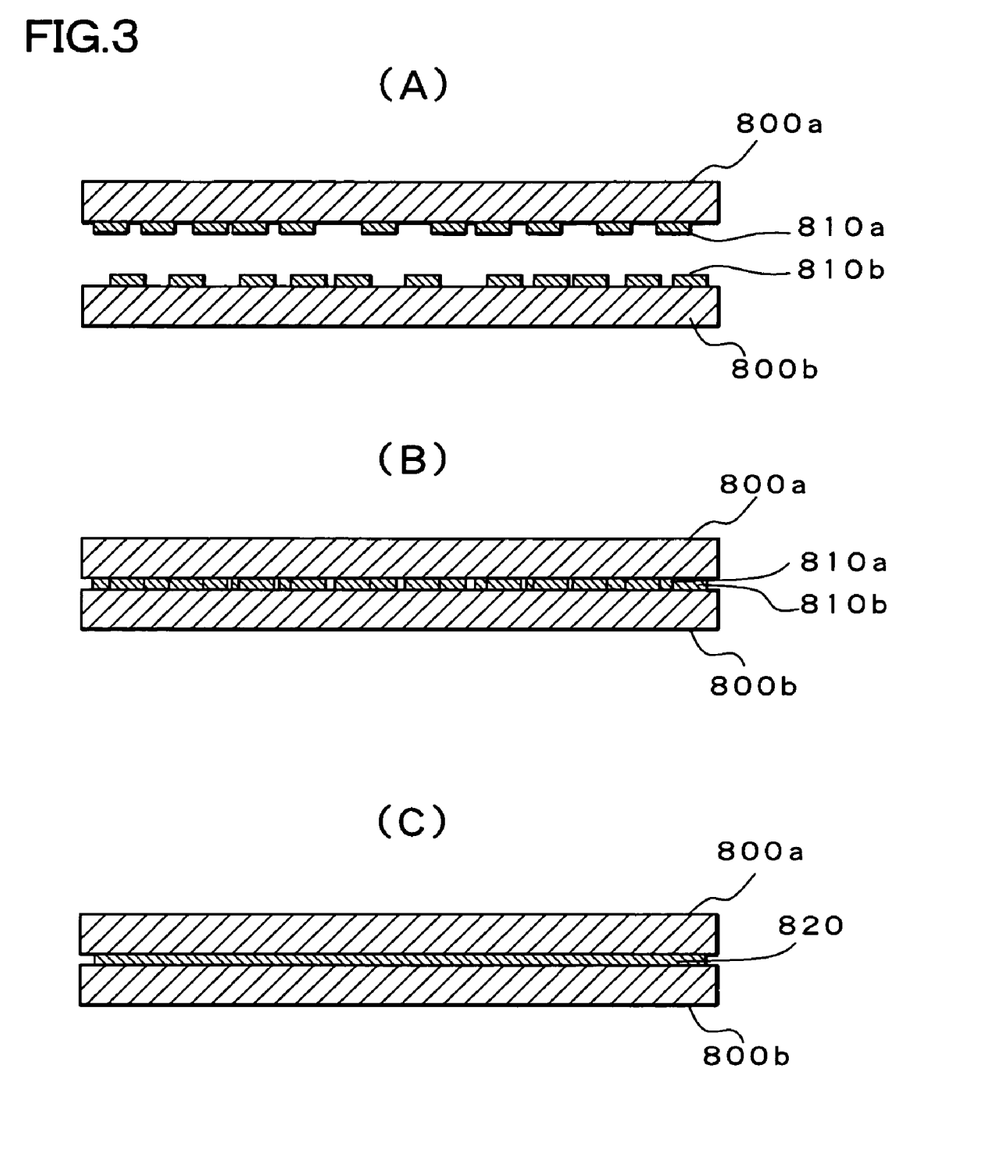
FIG. 3 is a process diagram depicting one example of a method for bonding of substrates by the use of the device for bonding of substrates shown in FIG. 1.

FIG. 3 is a diagram illustrating by a type section the process of treatment in the method of bonding substrates implemented by the use of the device 10 for the bonding of substrates in the present embodiment.

FIG. 3(A) illustrates the state of formation of island shaped thin metal films 810a, 810b on the surfaces of substrates 800a, 800b in consequence of the irradiation of the surfaces of substrates 800a, 800b respectively in a vacuum with both an inert gas beam (inert gas ion beam and/or inert gas neutral atom beam) and a metal beam (metal ion beam and/or metal neutral atom beam). During the course depicted in FIG. 3(A), the surfaces of the substrates 800 are substantially simultaneously cleaned respectively with an inert gas beam and subjected to vacuum deposition of metal with a metal beam.

During the course of FIG. 3(B), the substrates 800a, 800b are piled on top of each other by establishing mutual contact of the surfaces of the substrates 800a, 800b having the island shaped thin metal films 810 formed thereon respectively. As a result, the substrates 800a and 800b undergo surface-activated bonding through the island shaped thin metal films 810. Owing to the effect of surface activation with the inert gas ion beam or the inert gas neutral atom beam, surface-activated bonding occurs between the substrate 800a and a thin metal film 801a, between the thin metal film 810a and a thin metal film 810b, between the thin metal film 810b and the substrate 800b, between the thin metal film 810a and a substrate 800b, and between a substrate 800a and the thin metal film 810b and, as a whole, the substrates 800a and 800b are bonded.

The process of FIG. 3(B) is carried out at a low temperature. The actual temperature of this treatment is set in conformity with the nature and the specification of the substrates 800a, 800b. When the treating temperature is required to be lower than the solder melting temperature, this treatment is performed at a temperature of not more than 200° C., for example. When the substrates 800a, 800b happen to be made of a piezoelectric ceramic substance, the treatment is performed at a temperature lower than the Curie temperature such as, for example, a temperature of not more than 150° C. When the substrates 800a, 800b are glass substrates, the treatment is performed at a temperature of not more than 500° C. At the stage of the process depicted in FIG. 3(B), the basic treatment of the present embodiment is completed.

FIG. 3(C) illustrates an additional annealing treatment which can be executed after the treatment of FIG. 3(B). At the stage shown in FIG. 3(C), a heater 204 heats the substrates which have undergone the surface-activated bonding through the island shaped thin metal films 810a, 810b, and transforms the island shaped thin metal films 810a, 810b into a continued thin film 820. In bonding of substrates for an optical device, for example, the treatment for transforming the island shaped thin metal films 810a, 810b into the continuous thin film 820 proves effective.

The thin metal films 810a, 810b and the substrates 800a, 800b may be diffused each other by heating the substrates 800a, 800b which have undergone the surface-activated bonding through the island shaped thin metal films 810a, 810b. By the application of heat, for example, the metal atoms forming the thin metal films 810a, 810b are diffused in the direction of the substrates. As a result, the strength of the bonding of the substrates is exalted. Incidentally, the treatment of FIG. 3(C) may be optionally executed in conformity with the quality and the specification of the substrates 800a, 800b.

Incidentally, when the thin metal films 810a, 810b are formed in a continuous state having a thickness in the range of 1 nm-100 nm, preferably in the approximate range of 1 nm-100 nm, and more preferably in the range of 1 nm-5 nm instead of being formed in the shape of islands, a state similar to the state of FIG. 3(C) is obtained from the beginning. In this case, the range of thickness of the film metal films 810a, 810b is preferably set so as to avoid exceeding the depth of transmission of light in conformity with the transmission properties of the substrate.

Figure 4:
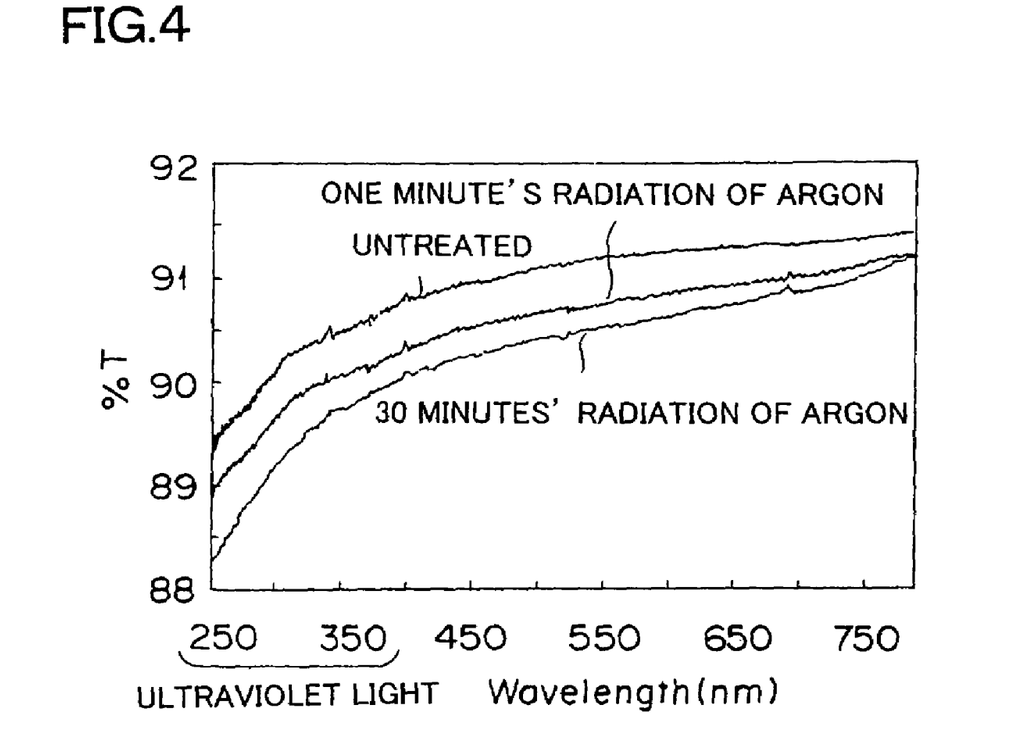
FIG. 4 is a view taken through a high resolution type transmission electron microscope of a quartz substrate produced by bonding by the use of the device for bonding substrates shown in FIG. 1.

FIG. 4 illustrates a view taken through a high resolution type transmission electron microscope of the mutual bonding of quartz substrates by the use of a device for bonding substrates in the present embodiment. The sample shown in FIG. 4 was bonded by using the grid 302 made of iron (Fe). The sample shown in FIG. 4 was subjected to the surface-activated bonding at room temperature and subsequently to a heat treatment (annealing) in the air under the atmospheric pressure. The annealing conditions were one hour of duration and 773 K (1046° C.) of temperature. In FIG. 4, the region shown in black on the upper side was a substrate 800a and the region shown on the lower side was a substrate 800b. Incidentally, in the neighborhood of the face of bonding of the substrates 800a, 800b, an amorphous layer approximating to 100 nm in thickness was formed. By the detection with an energy dispersion type X ray analyzing device (EDS), the face of bonding of the substrates 800a and 800b was confirmed to have formed a thin film of iron (Fe) 820. Meanwhile, no iron (Fe) was detected in the interiors of the substrates 800a, 800b. Thus, it was confirmed that the sample shown in FIG. 4 was endowed with a structure of quartz/Fe/quartz and that the quartz substrate and the quartz substrate were mutually bonded through a thin metal film formed of iron.

Incidentally, the substrates 800a and 800b do not need to be made of the same material. The metallic grid 302 which is formed of a substance other than iron (Fe) may be adopted herein. It was confirmed, though not illustrated, that the use of the grid 302 made of gold (Au) resulted in the formation of a structure of Si/Au/quartz. Thus, it was confirmed that a silicon substrate and a quartz substrate were mutually bonded through a thin metal film formed of gold. When this product of surface-activated bonding was subsequently annealed at 573 K (846° C.), the phenomenon of diffusion of gold (Au) in the direction of the silicon substrate was confirmed.

Figure 5:
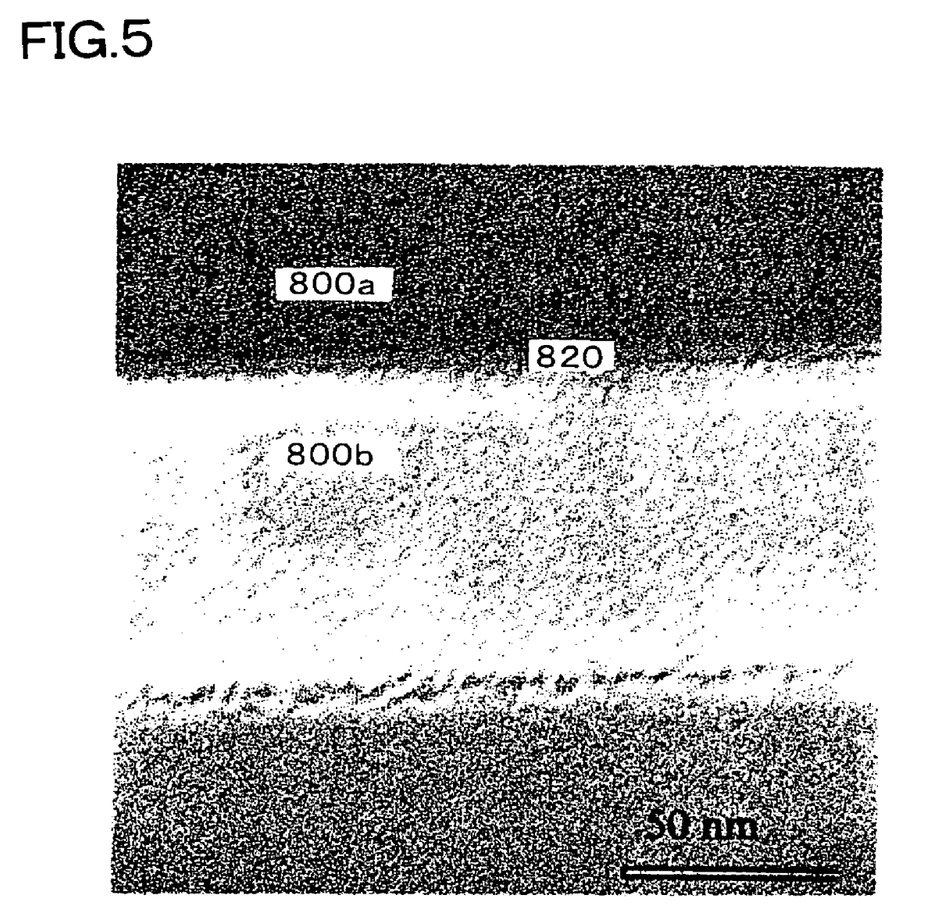
FIG. 5 is a diagram showing transmission factor obtained when island shaped thin metal films were formed on a quartz substrate by the use of the device for bonding of substrates shown in FIG. 1.
Figure 6:
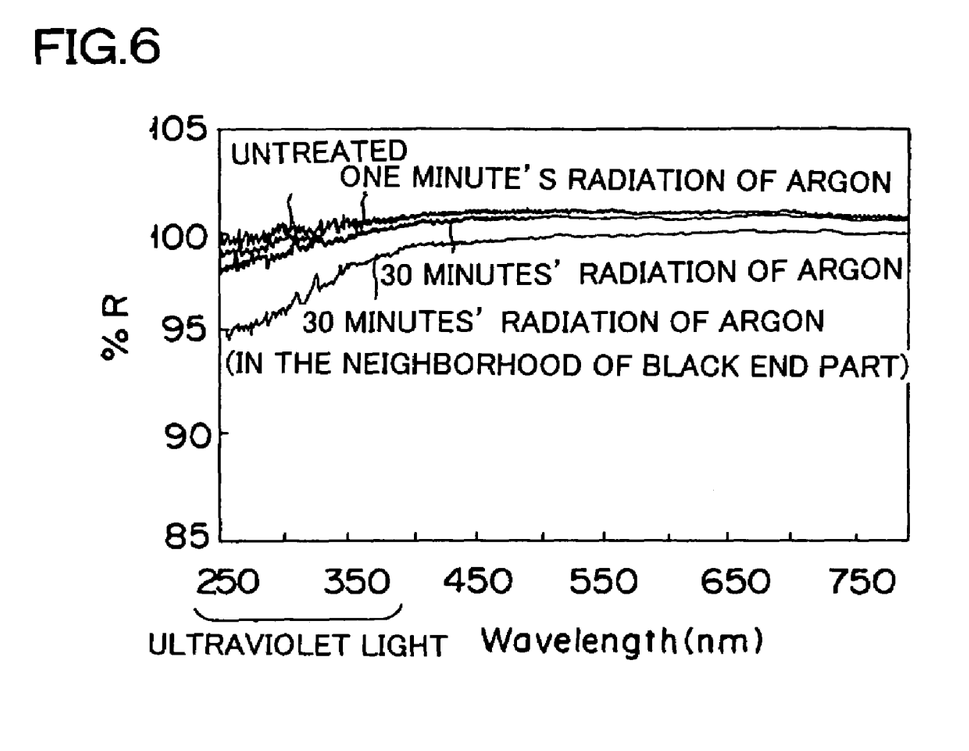
FIG. 6 is a diagram showing reflection factor obtained when island shaped thin metal films were formed on a quartz substrate by the use of the device for bonding of substrates shown in FIG. 1.

FIG. 5 and FIG. 6 show the coefficient of transmission and the coefficient of reflection obtained when the island shaped thin metal films were formed on quartz substrates by the use of the device of this embodiment for bonding of substrates. In the examples depicted in FIG. 5 and FIG. 6, the beam source 301 was used under the low energy conditions, specifically under the conditions of 80 V of voltage applied to the beam source 301 and 3A of plasma electric current. As the inert gas beam, an argon gas ion beam and an argon gas neutral atom beam were used. Then, as the grid 302, a grid made of iron was used. For the purpose of comparison, FIG. 5 and FIG. 6 shows the results of the determination obtained when the duration of radiation of an argon gas ion beam and an argon gas neutral atom beam was one minute and when this duration was 30 minutes and also the results of the determination obtained when no beam was radiated. Incidentally, even when the duration of radiation was about one minute, the presence of iron (Fe) in an amount exceeding the minimum detection limit of an Auger electron spectroscopic device was confirmed and the formation of a very thin metal film on the face of bonding of substrates 800 was confirmed.

The coefficient of transmission and the coefficient of reflection were determined in a wide range from the ultraviolet region through the visible light region. Though differences in the coefficient of transmission and the coefficient of reflection occurred depending on the presence and the absence of radiation, no appreciable difference occurred when the duration of radiation was one minute and when it was 30 minutes. An end part assuming a black color (a black end part) occurred when the duration of radiation of an argon gas atom beam was 30 minutes. The coefficient of reflection in the black end part was lower than in the other case. The duration of radiation of the argon gas atom beam, therefore, is preferred to be restricted to the extent of producing no black end part.

It is understood from the results shown in FIG. 5 and FIG. 6 that island shaped thin metal films were formed and the light could be transmitted fully satisfactorily through the thin metal film when the duration of radiation was in the approximate range of one minute through 30 minutes. According to the treatment for bonding substrates in the present embodiment, therefore, even when transparent substrates are mutually bonded during the manufacture of an optical device or an optical filter, the translucent property exhibited by the substrates to the light is not appreciably impaired because the thin metal films intervening between the substrates are sufficiently thin. Even when the thin metal films are not in the form of islands, they are enabled, by forming the thin metal films in a thickness smaller than the depth of light transmission and effecting the surface-activated bonding of the substrates through such thin metal films, to manifest the same effect.

Finally, the case of bonding semiconductor substrates will be described. Semiconductor substrates are provided with electronic circuits containing a metal electrode layer and an insulator layer on the surfaces of the substrates respectively.

Figure 7:
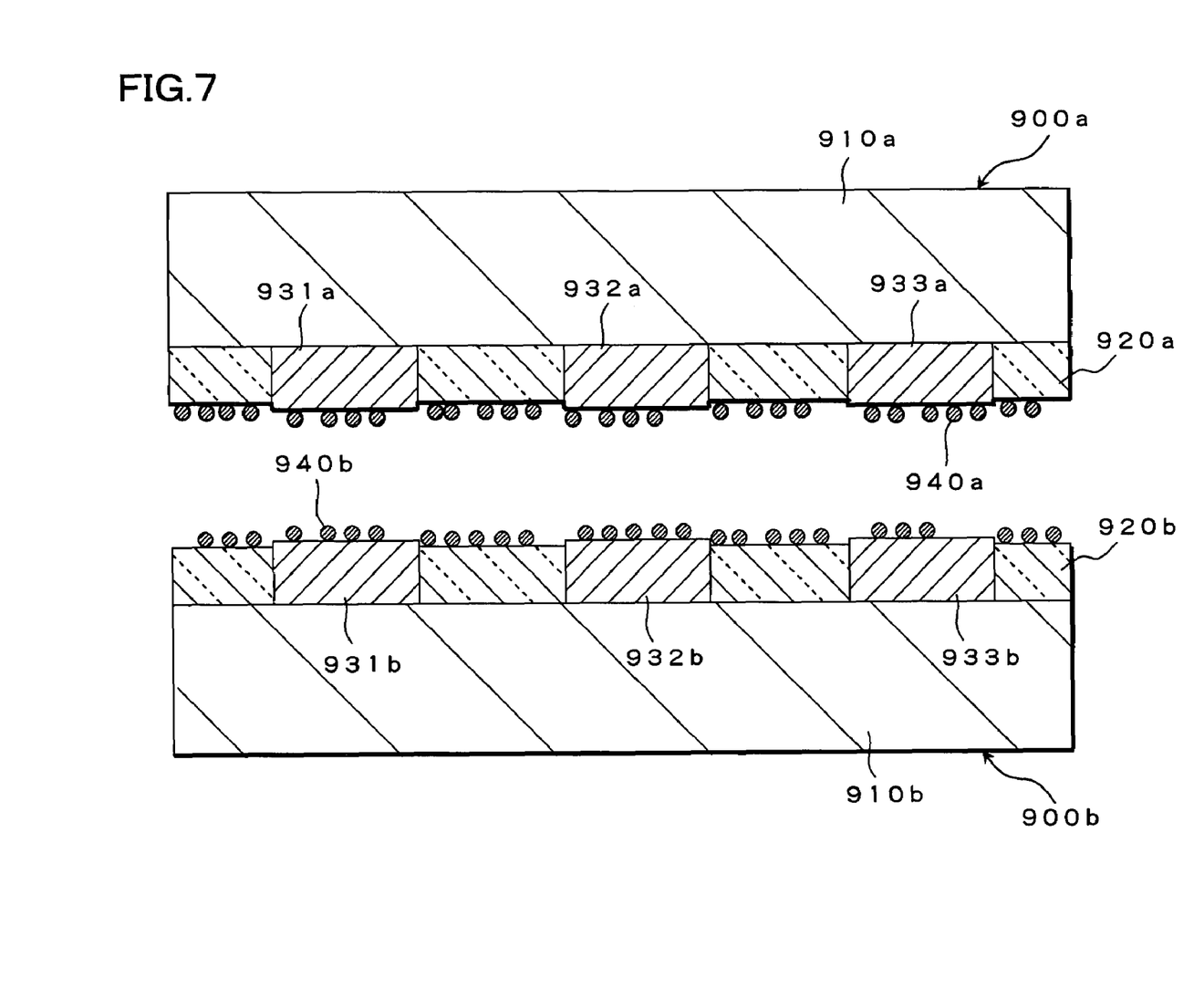
FIG. 7 is a diagram showing in a type section the contents of the processing in the case of the mutual bonding of semiconductor substrates provided with electronic circuits respectively.

FIG. 7 is a diagram illustrating in a type section the cross section of semiconductor substrates provided with electronic circuits (semiconductor circuit substrates). It illustrates in the type section the contents of the process performed in mutually bonding semiconductor circuit substrates by the device for bonding of substrates in the present embodiment. The case of subjecting semiconductor circuit substrates 900a and 900b to the surface-activated bonding will be explained below.

When the semiconductor circuit substrate 900a is taken for example, the semiconductor circuit substrate 900a is furnished with a silicon substrate 910a, an insulator film 920a formed of a silicon oxide layer or a silicon nitride layer on a surface of the silicon substrate 910a, and metal electrode layers (metal wiring layers) 931a-933a. The insulator film 920a functions as a protecting film. The insulator film 920a is provided in part thereof with an opening formed by the lithographic technique and the metal electrode layers 931a-933a are partly exposed through this opening. Here, the metal electrode layers 931a-933a are spaced by a pitch falling in the approximate range of 1 micro meter–10 micrometers. In the semiconductor substrate 900, n type and p type impurity layers (not shown) are formed by using a varying semiconductor process to give rise to various electronic circuits (not shown). The semiconductor circuit substrate 900b is similar in basic structure to the semiconductor circuit substrate 900a. The semiconductor circuit substrate 900b is provided at the positions opposite the metal electrode layers 931a-933a on the semiconductor circuit substrate 900a with metal electrode layers 931b-933b.

The surfaces of semiconductor circuit substrates 900a and 900b have been irradiated respectively in a vacuum with both an inert gas beam and a metal beam. As a result, island shaped thin metal films 940a, 940b each having a thickness of not more than 100 nm (preferably a thickness on the order of several nm) are formed on the surfaces of semiconductor circuit substrates 900a, 900b respectively.

The semiconductor circuit substrates 900a, 900b are so aligned by registration that the positions of the metal electrode layers 931a-933a coincide with the corresponding positions of the metal electrode layers 931b-933b. Then, in the aligned state, the surfaces having the metal thin films 940a, 940b formed thereon are brought into mutual contact. Consequently, the semiconductor circuit substrates 900a, 900b are subjected to the surface-activated bonding through the island shaped thin metal films 940a, 940b. This surface-activated bonding can be executed at a low temperature (such as, for example, the normal room temperature). As a result, the metal electrode layers 931a-933a and the corresponding metal electrode layers 931b-933b are electrically connected.

According to the treatment depicted in FIG. 7, the semiconductor circuit substrates 900a and 900b can be bonded at a low temperature in spite of the presence on their surfaces of the insulator films 920a, 920b which inherently incur difficulty in succumbing to the surface-activated bonding. Further, since the thin metal films 940a, 940b are interspersed in the form of islands within the surfaces of semiconductor circuit substrates, the probability that the metal electrode layers 931a-933a among themselves and the metal electrode layers 931b-933b among themselves will be short-circuited is low. If the metal electrode layers 931a-933a are mutually bonded by the thin metal films 940a, 940b, since the thin metal films 940a, 940b have a thickness on the order of several nm, for example, the magnitudes of electric resistance in the directions along the one surface heightened so that the short circuits among the metal electrode layers 941a-933a and among the metal electrode layers 931b-933b will not pose any problem. When the thin metal films 940a, 940b happen to have a thickness exceeding 100 nm, the metal electrode layers 931a-933a among themselves and the metal electrode layers 931b-933b among themselves are disposed to form short circuits without fail. Thus, the thickness of the thin metal films 940a, 940b is preferably not more than 100 nm and more preferably on the order of several nm.

As described above, the device 10 for bonding substrates in the present embodiment and the method for bonding substrates illustrated in FIG. 2 and FIG. 3 can manifest the following effects.

The island shaped thin metal films 810a, 810b having a thickness of several nm are formed on the surfaces of the substrates 800a, 800b by irradiating substantially simultaneously the surfaces of the substrates 800a, 800b respectively with both an inert gas beam (such as, for example, an argon gas ion beam and/or an argon gas neutral atom beam) and a metal beam (the ion beam of such a metal as iron or gold and/or the metal neutral atom beam) and the substrates 800a, 800b are mutually subjected to the surface-activated bonding through the island shaped thin metal films 810a, 810b. As a result, the substrates 800a, 800b made of quartz, silicon oxide, or silicon nitride which have not been easily bonded by the conventional technique of surface-activated bonding can be mutually bonded by the surface-activated technique. Further, since the surface-activated bonding is utilized, the treatment can be implemented at a low temperature as compared with the technique of bonding substrates by mean of soldering and the bonding can be executed at the normal room temperature, for example.

The beam radiating part 300 is furnished with the beam source 301 for emitting an inert gas beam and the grid 302 made of iron or gold and disposed at the opening of the beam source 301. The metal beam is generated by the collision of the inert gas beam against the metallic grid 302. As a result, the one beam source (gun) 301 is capable of radiating an argon ion beam and/or an argon neutral atom beam and a metallic ion beam of iron or gold and/or the metallic neutral atom beam. The necessity for preparing a plurality of beam sources, therefore, can be obviated and the saving of space can be realized. By preparing grids 302 made of different metals and selectively using them, it is made possible to manufacture island shaped thin metal films of optionally selected materials. Further, since the inert gas beam and the metal beam are radiated substantially simultaneously owing to the structures of the beam source 301 and the grid 302, the cleaning of the surfaces of the substrates and the deposition of metals can be simultaneously executed. As a result, the surfaces of the substrates and the surfaces of the island shaped thin metal films can be activated fully satisfactorily and the surface-activated bonding of excellent quality can be accomplished.

The voltage applied to the beam source 301 is adjusted because an increase of the energy (such as, for example, applied voltage) exerted on the beam source 301 is liable to promote separation of the thin metal film from the surfaces of the substrates 800 and a decrease of this energy is liable to permit the thin metal films to persist on the surfaces of the substrates 800. As a result, it is made possible to control the thickness of the thin film of iron or gold and form an island shaped thin metal film in a thickness on the order of several nm. By adjusting the voltage applied to the beam source 301, for example, it is made possible to prevent the metal on the surfaces of the substrates 800 from being wholly separated and accomplish the formation of thin metal films of a necessary thickness on the surfaces of the substrates 800 respectively.

Since the substrates 800a, 800b which have been irradiated are piled on top of each other and nipped and compressed, the weight necessary and sufficient can be exerted on the entire surfaces of the substrates and the substrates 800a and 800b can be infallibly bonded.

Further, the strength of bonding of the substrates 800a and 800b can be optionally exalted by heating the substrates 800a, 800b which have undergone the surface-activated bonding through the island shaped thin metal films 810a, 810b and consequently enabling the thin metal films 810a, 810b to be diffused through reaction with the substrates 800a, 800b.

Optionally, the scatter of the light in the interface in a sample resulting from mutual bonding of optical device substrates can be alleviated by heating the substrates 800a, 800b which have undergone the mutual surface-activated bonding through the island shaped thin metal films 810a, 810b and consequently transforming the island shaped thin metal films 810a, 810b into continuous thin films 820.

When the average thickness of the island shaped thin metal films is set within the range of 1 nm-100 nm, the transmissibility of light in the substrates is not appreciably impaired even when the transparent substrates being used in the manufacture of an optical device or an optical filter are mutually bonded because the thin metal films interposed between the substrates are thin fully satisfactorily. Further, during the mutual bonding of semiconductor circuit substrate, the influence of the mutual short-circuiting of the metal electrode layers can be alleviated because the mutual bonding results in heightening the electric resistance in the direction along the surface of substrate.

Particularly, the semiconductor circuit substrates 900a, 900b in the state provided on the surfaces with the metal electrode layers 931a-933a and 931b-933b and protected by the insulator layers 920a, 920b (silicon oxide or silicon nitride) can be mutually bonded without resorting to the process of soldering. As a result, an electronic device furnished with a stereo structure can be manufactured by bonding two or more semiconductor circuit substrates. Since the semiconductor circuit substrates are mutually bonded through island shaped thin metal films, the semiconductor circuit substrates can be bonded with fully satisfactory strength while the metal electrode layers contiguous to the face of bonding are being prevented from forming an unnecessary short-circuit.

The preferred embodiment of this invention has been described. The method for bonding of substrates and the device for bonding of substrates according to this invention, however, do not need to be restricted to this preferred embodiment. Though argon has been taken as an example of the inert gas, this invention allows use of other rare gas element as the inert gas.

While the inert gas beam and the metal beam are preferred to be simultaneously radiated, it is permissible to radiate either the inert gas ion beam or the inert gas neutral atom beam prior to the other. From the viewpoint of saving space, the beam radiating part is preferred to include one beam source and a metallic grid annexed thereto. This invention, however, does not need to be restricted to this configuration. Optionally, a beam source exclusively used for radiating an inert gas beam may be disposed separately.

What is claimed is:

1. A method for bonding of substrates, comprising the steps of:
   generating an inert gas beam;
   generating a metal beam directed in substantially the same direction as said inert gas beam by directing said inert gas beam at a structure comprising said metal, wherein said metal is selected from the group consisting of iron, titanium, and gold;
   irradiating surfaces of the substrates respectively in a vacuum simultaneously with both the inert gas beam and the metal beam generated using the inert gas beam, thereby forming a multiplicity of island shaped thin metal films on the surfaces of the substrates and surface-activated bonding of the substrates through the island shaped thin metal films by contacting the surfaces of the substrates each other.

2. A method for bonding of substrates according to claim 1, wherein the inert gas beam is an inert gas ion beam and/or an inert gas neutral atom beam and the metal beam is a metal ion beam and/or a metal neutral atom beam.

3. A method for bonding of substrates according to claim 1, wherein the inert gas beam and the metal beam are irradiated substantially simultaneously.

4. A method for bonding of substrates according to claim 1, wherein the step of surface-activated bonding includes a step of holding and compressing the irradiated substrates.

5. A method for bonding of substrates according to claim 1, further comprising a step of diffusing the island shaped thin metal films into the substrates by heating the bonded substrates.

6. A method for bonding of substrates according to claim 1, further comprising a step of transforming the island shaped thin metal films into a continuous thin film by heating the bonded substrates.

7. A method for bonding of substrates according to claim 1, wherein the island shaped thin metal films have 1 nm to 100 nm film thicknesses respectively.

8. A method for bonding of substrates according to claim 1, wherein the voltage applied to a beam source for emitting an inert gas beam is in the range of 50 V-500V.

9. A method for bonding of substrates according to claim 1, wherein the substrates are formed of one or more materials selected from the group consisting of semiconductor, ceramics, glass, and plastic.

10. A method for bonding of substrates according to claim 1, wherein the substrates are semiconductor substrates provided with electronic circuits containing a metal electrode layer and an insulator layer on the surfaces of the substrates respectively.

11. A method for bonding substrates, comprising the steps of:
    generating an inert gas beam;
    generating a metal beam directed in substantially the same direction as said inert gas beam by directing said inert gas beam towards a structure composed of said metal and wherein said metal is selected from the group consisting of iron, titanium, and gold; and
    irradiating surfaces of the substrates respectively in a vacuum simultaneously with both the inert gas beam and the metal beam thereby forming a multiplicity of thin metal films having 1 nm to 10 nm film thicknesses respectively on the surfaces of the substrates and surface-activated bonding of the substrates through the thin metal films by contacting the surfaces of the substrates each other.

* * * * *

UNITED STATES PATENT AND TRADEMARK OFFICE
CERTIFICATE OF CORRECTION

| | | |
|---|---|---|
| PATENT NO. | : 7,550,366 B2 | Page 1 of 1 |
| APPLICATION NO. | : 11/293663 | |
| DATED | : June 23, 2009 | |
| INVENTOR(S) | : Tadatomo Suga | |

It is certified that error appears in the above-identified patent and that said Letters Patent is hereby corrected as shown below:

Title Page

In section (73) Assignee:

Please ADD: Tadatomo Suga, Tokyo Japan

Signed and Sealed this

Twenty-second Day of June, 2010

David J. Kappos
*Director of the United States Patent and Trademark Office*